(12) United States Patent  
Herman et al.

(10) Patent No.: US 7,291,522 B2
(45) Date of Patent: Nov. 6, 2007

(54) SEMICONDUCTOR DEVICES AND METHODS OF MAKING

(75) Inventors: Gregory Herman, Albany, OR (US); Peter Mardilovich, Corvallis, OR (US); Randy Hoffman, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 31 days.

(21) Appl. No.: 10/975,873

(22) Filed: Oct. 28, 2004

(65) Prior Publication Data

US 2006/0091460 A1 May 4, 2006

(51) Int. Cl.
*H01L 21/00* (2006.01)

(52) U.S. Cl. ............................. 438/159; 257/E21.414
(58) Field of Classification Search ............... 438/159; 257/E21.414

See application file for complete search history.

(56) References Cited

U.S. PATENT DOCUMENTS

| | | | |
|---|---|---|---|
| 4,602,192 A | 7/1986 | Nomura | |
| 4,943,838 A | 7/1990 | Ukai | |
| 4,994,401 A | 2/1991 | Ukai | |
| 5,574,291 A | 11/1996 | Dodabalapur et al. | |
| 5,879,977 A | 3/1999 | Zhang et al. | |
| 5,946,551 A | 8/1999 | Dimitrakopoulos et al. | |
| 6,156,583 A * | 12/2000 | Hwang | 438/30 |
| 6,274,412 B1 | 8/2001 | Kydd et al. | |
| 6,284,562 B1 | 9/2001 | Batlogg et al. | |
| 6,294,401 B1 | 9/2001 | Jacobson et al. | |
| 6,300,659 B1 | 10/2001 | Zhang et al. | |
| 6,344,660 B1 | 2/2002 | Dimitrakopoulos et al. | |
| 6,344,662 B1 | 2/2002 | Dimitrakopoulos et al. | |
| 6,355,299 B1 | 3/2002 | Forbes et al. | |
| 6,396,105 B1 | 5/2002 | Yamazaki et al. | |
| 6,414,164 B1 | 7/2002 | Afzali-Ardakani et al. | |
| 6,498,114 B1 | 12/2002 | Amundson et al. | |
| 6,506,438 B2 | 1/2003 | Duthaler et al. | |
| 6,555,411 B1 | 4/2003 | Bao et al. | |
| 6,566,714 B2 | 5/2003 | Deane et al. | |
| 6,596,569 B1 | 7/2003 | Bao et al. | |
| 6,605,494 B1 | 8/2003 | Park et al. | |
| 6,621,098 B1 | 9/2003 | Jackson et al. | |
| 6,667,188 B2 | 12/2003 | Tanabe | |
| 6,693,044 B1 | 2/2004 | Yamazaki et al. | |
| 6,713,330 B1 | 3/2004 | Zhang et al. | |
| 6,723,394 B1 | 4/2004 | Sirringhaus et al. | |
| 6,736,985 B1 | 5/2004 | Bao et al. | |
| 6,740,547 B2 | 5/2004 | Zhang | |
| 6,747,288 B2 | 6/2004 | Yamazaki et al. | |
| 6,773,969 B2 | 8/2004 | Lee et al. | |
| 2002/0004260 A1 | 1/2002 | Furut et al. | |
| 2003/0059984 A1 | 3/2003 | Sirringhaus | |
| 2003/0111663 A1 | 6/2003 | Yagi | |
| 2004/0029382 A1 | 2/2004 | Kawase | |

FOREIGN PATENT DOCUMENTS

| | | |
|---|---|---|
| EP | 0273743 | 7/1988 |
| WO | WO03/056641 | 7/2003 |

OTHER PUBLICATIONS

Markoff, John, HP bets inkjets will open new markets, International Herald Tribune, Oct. 10, 2004, pp. 2.

* cited by examiner

*Primary Examiner*—Lex Malsawma

(57) ABSTRACT

In one method of forming a semiconductor device, a first electrode is formed electrically coupled with a semiconductor material. After the first electrode is formed, an insulator is formed over the semiconductor material adjoining the first electrode and extending a selected distance from the first electrode. After the insulator is formed, a second electrode is formed electrically coupled with the semiconductor material adjoining the insulator.

18 Claims, 6 Drawing Sheets

SEMICONDUCTOR DEVICES AND METHODS OF MAKING

BACKGROUND

A field effect transistor (FET) typically comprises a drain electrode and a source electrode connected by a channel of semiconductor material, and a gate electrode separated from the channel by an insulating layer. The length of the channel from the source to the drain affects the properties of the transistor and, in particular, affects the speed at which the transistor can be switched on and off.

DETAILED DESCRIPTION

Figure 1:
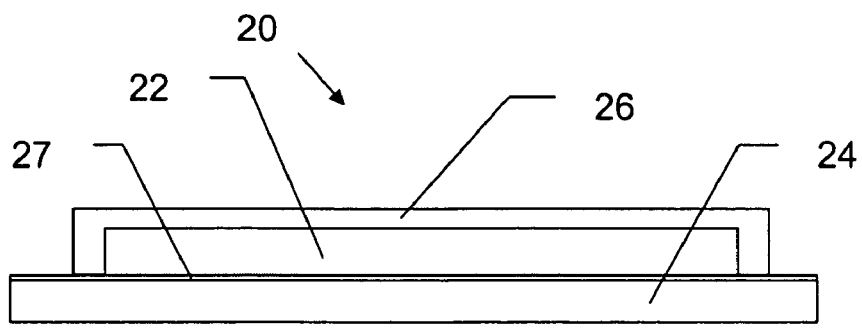
FIG. 1 is a schematic sectional view of a partly formed first embodiment of a transistor according to an embodiment of the invention.

Referring to the drawings, and initially to FIG. 1, in one embodiment of a method of forming a field effect transistor (FET), indicated generally by the reference numeral 20, a gate electrode 22 is applied to a substrate 24, and is covered by a dielectric layer 26. In this embodiment the gate electrode 22 may be of aluminum, and may then be anodized to form an aluminum oxide dielectric layer approximately 5 to 500 nm thick. Anodization is a process whereby a metal is electrochemically oxidized, with voltage applied such that the metal is the anode. After deposition the gate dielectric 26 may be annealed, for example, by thermal processing. The gate electrode 22 may project beyond the dielectric layer 26 at one side, so that there is an exposed part of the gate electrode that can be connected to an electrical circuit. However, other methods of connecting to the gate electrode may be used. The substrate 24 may be part of a larger electrical or electronic circuit structure, and may include a connection to the gate electrode 22. There may be a layer such as an insulator 27 between the larger substrate 24 and the gate electrode 22. An insulator layer 27 may be appropriate, for example, in an embodiment in which the larger substrate 24 is of electrically conductive material.

Figure 2:
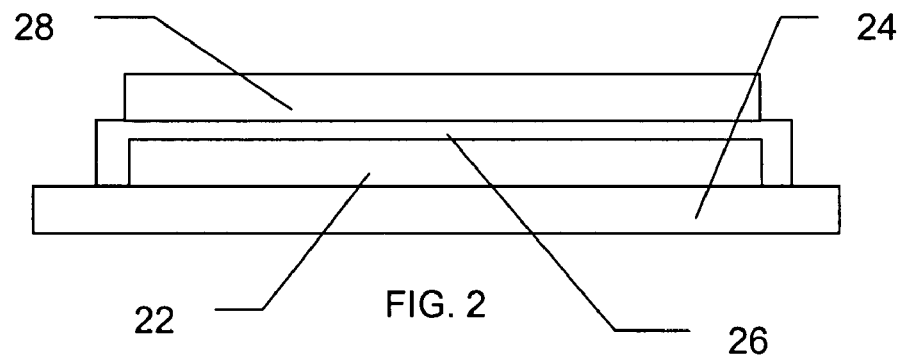
FIG. 2 is a schematic sectional view showing the transistor of FIG. 1 at a later stage in formation.

Referring now to FIG. 2, a strip of semiconductor material 28 is applied over the gate dielectric. In this embodiment, the semiconductor material may be, for example, a zinc-tin oxide material, and may be formed, for example, by RF sputtering or by being deposited from a sol-gel precursor that comprises partially hydrolyzed and/or oligomerized metal alkoxides in an alcohol solution. The width and thickness of the semiconductor strip 28 affect the current flow through the finished transistor, and so are controlled when the strip is formed. As will be explained below, the length of the semiconductor strip 28, which is the dimension extending from left to right in FIG. 2, is relatively unimportant, provided that it is long enough to contact both the source and drain electrodes, and is not so long as to interfere with neighboring circuit elements. After deposition the semiconductor strip 28 may be annealed, for example, by laser annealing or by thermal processing.

Figure 3:
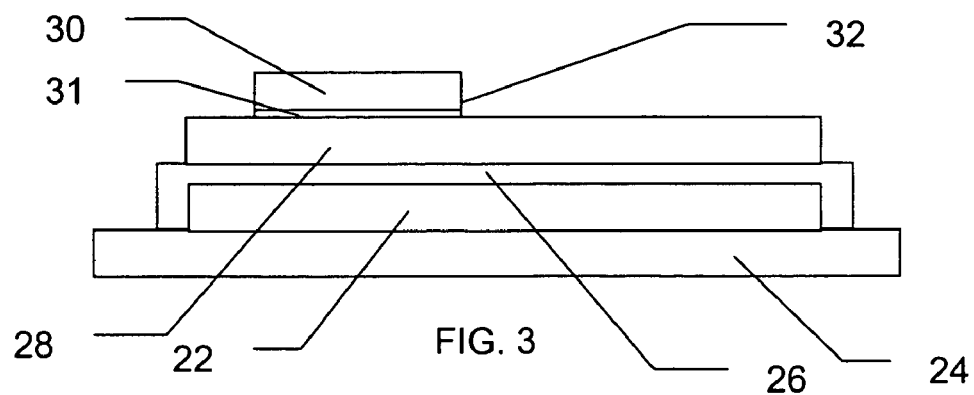
FIG. 3 is a schematic sectional view showing the transistor of FIG. 2 at a later stage in formation.

Referring now to FIG. 3, a source or drain electrode 30 is then applied over the semiconductor strip 28. The basic structure of an FET is sufficiently nearly symmetrical that either the source or the drain may be the electrode 30, or it may not even be determined at this stage which is which. However, for some purposes the source and drain electrodes may be made of different metals. In this embodiment, the electrode 30 consists of aluminum, tantalum or another metal that can be anodized, such as tungsten, bismuth, antimony, niobium, or alloys thereof, including alloys of aluminum and tantalum with one another, with the other metals mentioned above, and with Ag, Cd, Cr, Cu, Fe, Mg, Sn, Ti, W, Zn, Zr, and combinations thereof. An optional underlayer 31 of some material that forms a better electrical contact with the semiconductor and/or improves adhesion may optionally be applied before the electrode 30 is deposited. One edge 32 of the electrode 30 extends substantially across the width of the semiconductor strip 28. The exact position of the edge 32 is unimportant, provided that there is sufficient overlap between the electrode 30 and the semiconductor strip 28 for adequate current transfer between them. The location of the opposite edge of the electrode 30 is also relatively unimportant, although again, there must be provided sufficient overlap between the electrode 30 and the semiconductor strip 28 for adequate current transfer between them. The source or drain electrode 30 may project beyond the dielectric layer 26 and the substrate 24 at one side, so that there is an exposed part of the electrode that can be connected to an electrical circuit. However, other methods of connecting to the electrode 30 may be used.

The edge face 32 may be formed so as to be smooth to a fraction of the intended channel length. The electrode 30 may be formed by existing techniques such as sputtering or other vacuum deposition processes in combination with photolithography, imprinting, shadow masking, laser ablation, or the like. By utilizing the single edge face 32, the techniques used are not restricted to techniques capable of fine resolution.

Figure 4:
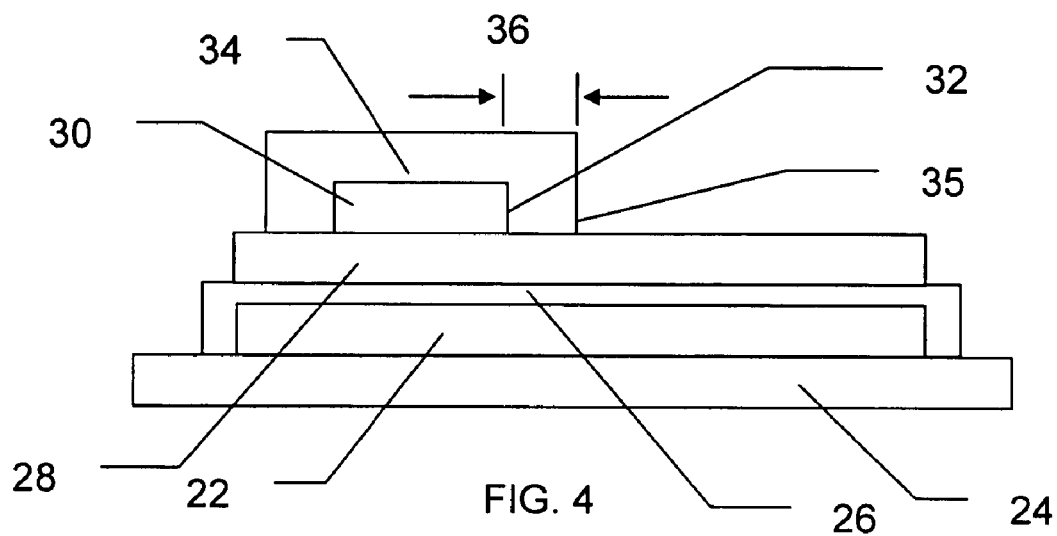
FIG. 4 is a schematic sectional view showing the transistor of FIG. 3 at a later stage in formation.

Referring now to FIG. 4, in this embodiment the source or drain electrode 30 is anodized, to form an insulating layer 34 of oxide. One edge 35 of the insulating layer 34 extends substantially across the width of the semiconductor strip 28, parallel to and spaced from the edge 32. The anodization is controlled so that the width 36 of the insulating layer 34 between the electrode edge 32 and the insulator edge 35 is equal to the intended channel length of the finished transistor, and the insulating layer is smooth and uniform to a fraction of the intended channel length. The width is measured along the surface of the semiconductor strip 28 and in a direction perpendicular to the lines defined by the intersections of edge 32 and 35 and the surface of semiconductor strip 28. In this embodiment, the edge face 32 is approximately perpendicular to the surface of the semiconductor strip 28, so the width 36 is approximately equal to the thickness of the layer 34. In this embodiment, the insulating layer 34 may be, for example, approximately 20 nm to 1 μm thick. For a thin film FET with a switching frequency of several MHz, the channel length may be in the region of a few micrometers, assuming a moderate channel mobility value. An insulating layer 34 of this thickness and the appropriate smoothness and uniformity can be formed by existing anodization techniques. In this embodiment, if the insulating layer 34 is more than about 300 nm thick, it may be formed by a two-step anodization process. First, a porous alumina layer can be formed by anodization in an electrolyte based on, for example, oxalic, sulfuric, chromic, and/or phosphoric acid or their mixtures. Next, a dense or barrier-type alumina layer can be formed by anodization in an electrolyte based on, for example, citric, boric, or tartaric acid.

Figure 5:
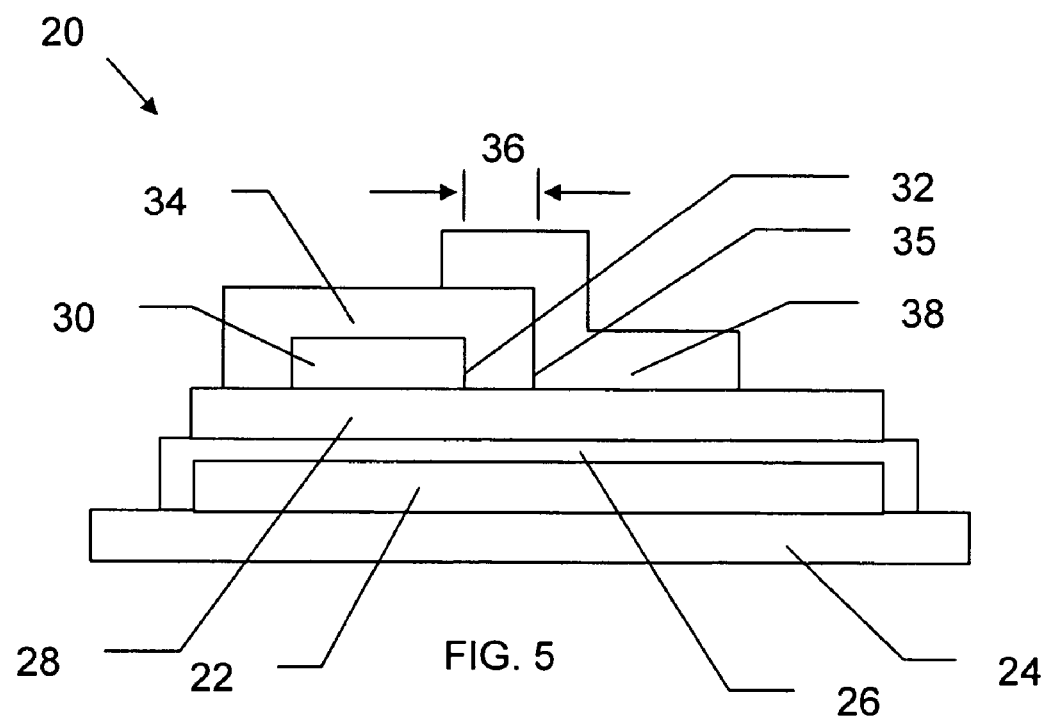
FIG. 5 is a schematic sectional view showing the transistor of FIG. 4 at a later stage in formation.

Referring now to FIG. 5, the second source or drain electrode 38 is then applied onto the semiconductor strip 28, abutting the insulating layer 34 that covers the edge 32 of the first source or drain electrode 30. As may be seen from FIG. 5, there is considerable tolerance in the exact position of the second source or drain electrode 38 relative to the first source or drain electrode 30, because the channel length 36 is not affected by the position of either edge of the second source or drain electrode 38, as long as the second electrode 38 extends at least across the nearest edge 35 of insulating layer 34. The two electrodes 30 and 38 may even overlap one another, because they are separated by the dielectric layer 34. The electrode 38 may be formed by the same techniques as the electrode 30, or by other low-precision deposition and patterning techniques, including inkjet printing, offset lithography, flexography, gravure, extrusion, screen printing, dry electrophotographic (DEP) printing, and liquid electrophotographic (LEP) printing.

The positions of none of the edges of the elements 22, 26, 28, 30, 38 affects the channel length, as long as their positions are such as to ensure the necessary overlaps as described above, and none of the elements has to be as small as the channel length. Apart from the width of the semiconductor strip 28, which may affect the current-carrying capacity of the transistor 20, the principal properties of the transistor are determined by layer thicknesses. The width of the semiconductor strip 28 is typically considerably larger than the channel length 36. None of the steps used in fabricating the transistor 20 requires a patterning resolution fine enough to form the dimension 36 directly. This makes it possible for the transistor 20 to be formed by comparatively simple and economical processes, while simultaneously obtaining a relatively small channel length dimension.

Figure 6:
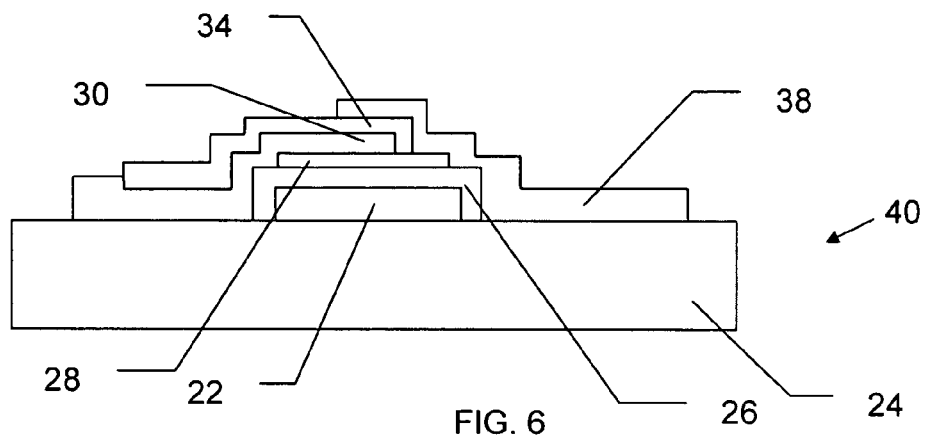
FIG. 6 is a schematic sectional view, similar to FIG. 5, of a second embodiment of a transistor according to an embodiment of the invention.

Referring now to FIG. 6, a second embodiment 40 of a transistor is generally similar to the embodiment 20 shown in FIG. 5, and is made by a method generally similar to that described with reference to FIGS. 1 to 5. In the embodiment shown in FIG. 6, the gate electrode 22 is aluminum, and is covered with a dielectric layer 26 by anodizing. The semiconductor layer 28 is zinc tin oxide. The electrode 30, which is the drain electrode, is aluminum. The insulating layer 34 can be formed by anodizing the aluminum electrode 30 to aluminum oxide. The source electrode 38 can be formed of indium tin oxide.

Figure 7:
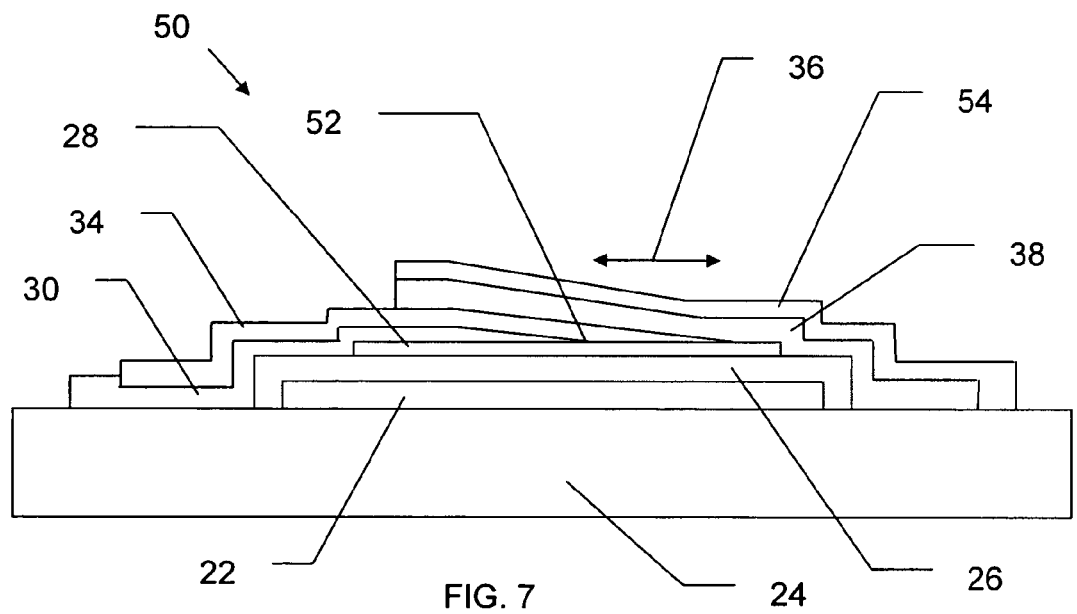
FIG. 7 is a schematic sectional view, similar to FIG. 6, of a third embodiment of a transistor according to an embodiment of the invention.

Referring now to FIG. 7, a third embodiment 50 of a transistor is generally similar to the second embodiment 40. In the transistor 50, the drain electrode 30 can be formed by vacuum sputtering with a shadow mask. As is shown in FIG. 7, the shadow mask produces an edge 52 that tapers away gradually. The insulating layer 34 can be formed by anodizing the aluminum electrode 30 to aluminum oxide. Because of the gentle taper of the edge 52, the width of the aluminum oxide layer measured along the underlying semiconductor layer 28, which is the eventual channel length 36, may be substantially greater than the thickness of the aluminum oxide layer. With this embodiment of the transistor 50, the channel length 36 may be, for example, 30 to 40 μm, even though the thickness of the dielectric layer 34 may be only about a few hundred nanometers. The source electrode 38 can be formed of indium tin oxide and in an alternate embodiment can include a gold overlayer 54.

In an alternative form of the third embodiment shown in FIG. 7, after the aluminum drain electrode 30 is deposited and before it is anodized, the edge 52 of the aluminum is etched or otherwise patterned to form an edge face similar to the edge face 32 shown in FIG. 5, roughly perpendicular to the surface of semiconductor layer 28. The patterning may be carried out by existing processes, such as conventional photolithography and etching. Because there is considerable tolerance in the position of the edge face 32, and because it is not necessary to form a narrow structure, comparatively low-precision processes can be used.

Figure 8:
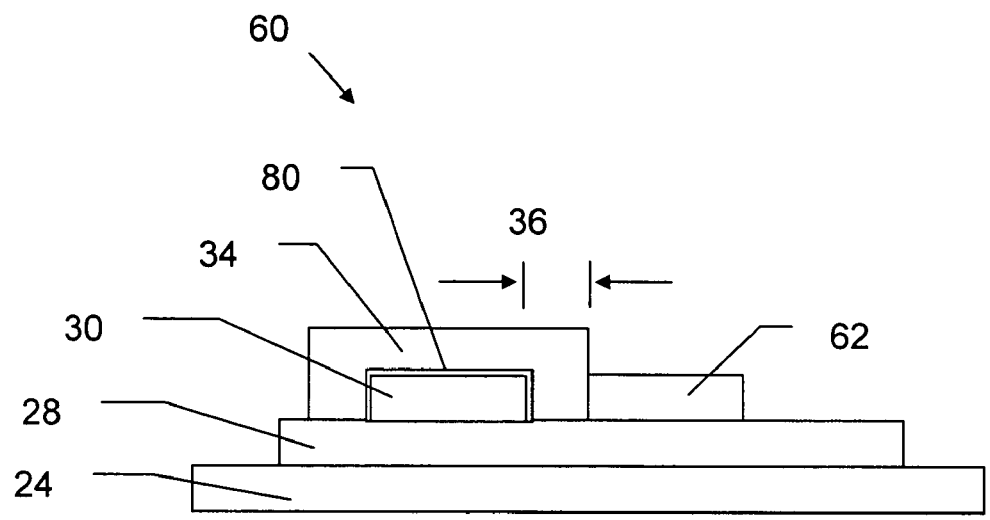
FIG. 8 is a schematic sectional view of a partly formed fourth embodiment of a transistor according to an embodiment of the invention.
Figure 9:
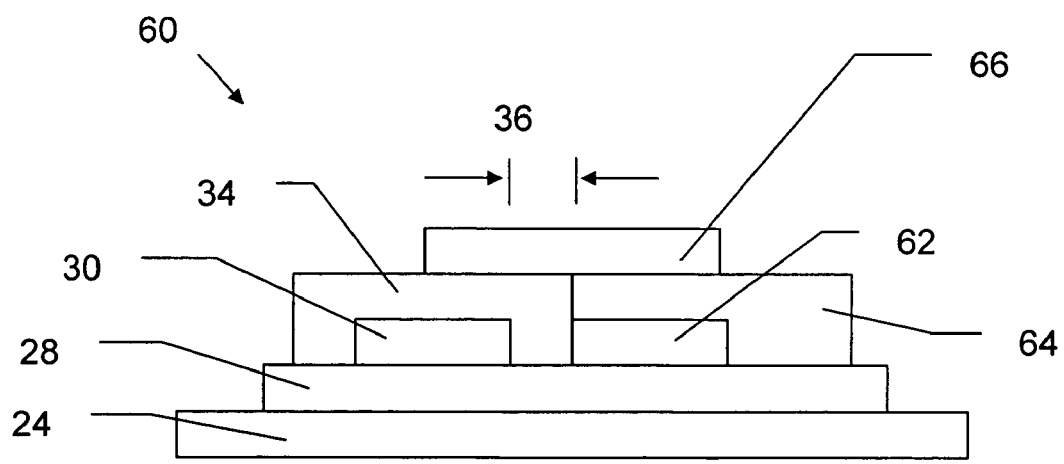
FIG. 9 is a schematic sectional view showing the transistor of FIG. 8 at a later stage in formation.

Referring now to FIGS. 8 and 9, and initially to FIG. 8, in a fourth embodiment 60 of a transistor, the semiconductor strip 28 can be formed directly on the substrate 24, without first forming a gate electrode 22. The first source or drain electrode 30 and the anodized oxide or other dielectric coating 34 covering it are then formed as described with reference to FIGS. 3 and 4. The second source or drain electrode 62 is applied by a liquid-phase process and can be formed from a material that wets the semiconductor 28 but does not wet the dielectric coating 34. The material of the electrode 62 then tends to form a layer of fairly uniform thickness on the semiconductor 28, without spreading up the dielectric layer 34. The material of the electrode 62 does not need to adhere strongly to the dielectric layer, provided that it lies close enough to the dielectric layer that the thickness of the dielectric layer 34 accurately determines the channel length 36 between the electrodes 30 and 62.

Referring now to FIG. 9, a dielectric layer 64 is then deposited over the electrode 62, and optionally over at least a portion of dielectric layer 34. A gate electrode 66 is then formed, by any convenient method, over at least a portion of the dielectric layers 34 and 64, so as to cover at least the region defined by the source to drain gap 36.

Figure 10:
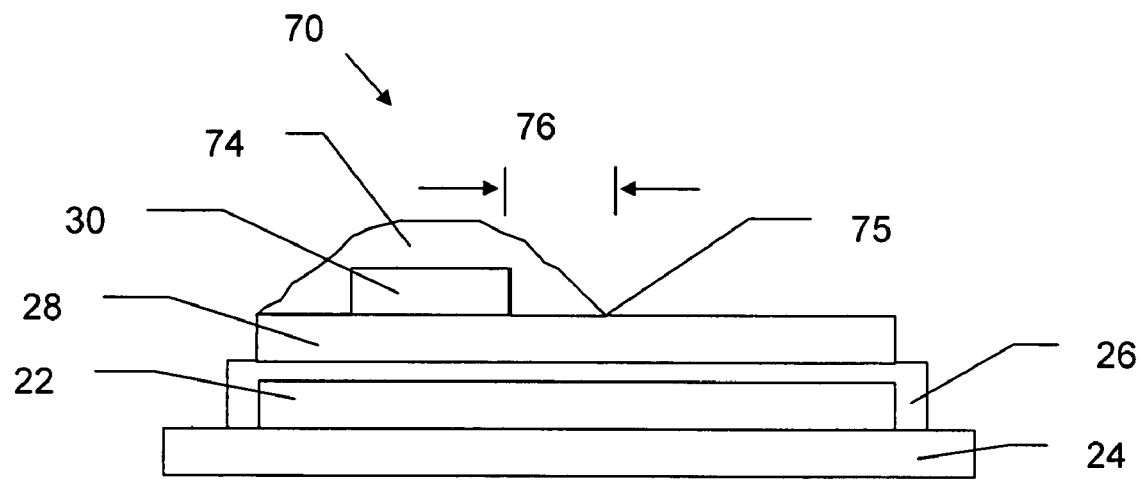
FIG. 10 is a schematic sectional view, similar to FIG. 4, of a partly formed fifth embodiment of a transistor according to an embodiment of the invention.
Figure 11:
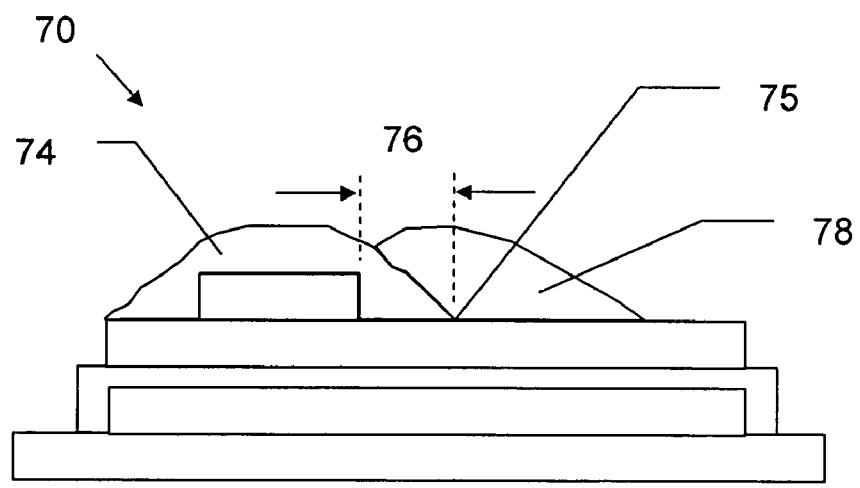
FIG. 11 is a schematic sectional view, similar to FIG. 5, showing the transistor of FIG. 10 at a later stage in formation.

Referring now to FIGS. 10 and 11, and initially to FIG. 10, in a fifth embodiment 70 of a transistor the substrate 24, gate 22, gate dielectric 26, semiconductor 28, and first source or drain electrode 30 are formed substantially as described above with reference to FIGS. 1 to 3. A dielectric layer 74 is then applied over the electrode 30 by a printing process, such as thermal inkjet (TIJ), piezo inkjet, liquid electrophotographic (LEP), dry electrophotographic (DEP), offset lithography, flexography, gravure, extrusion, or screen printing. With these printing processes, accurate printing of sharp edges is possible, but it is difficult to print very fine lines. The minimum line width is currently typically more than 10 μm. However, for the dielectric layer 74 there is considerable tolerance in the width. Only the position of one edge, the right-hand edge 75 as seen in FIG. 10, needs to be controlled, because the distance of that edge from the edge of the electrode 30 determines the channel length 76 of the finished transistor 70. The printed material 74 that defines the channel length 76 can be chosen from materials such as silane coupling agents, alkane thiols, and others that have a propensity for preferential attachment to the source or drain electrode 30 as opposed to the semiconductor material 28. Furthermore, the right-hand edge 75 of the dielectric layer 74 may be aligned to a registration mark that was deposited in the same operation as the electrode 30, or the right-hand edges of the electrode 30 and the dielectric layer 74 may be successively aligned to a registration mark or other suitable datum provided at an earlier stage.

Referring now to FIG. 11, the second source or drain electrode 78 is then applied by any convenient method, including a printing process. As in the case of the second source or drain electrode 38 shown in FIG. 5, the position of the electrode 78 is not critical, provided that the electrode 78 overlaps at least the edge 75 of the dielectric 74, and provided that the electrode 78 does not extend far enough to contact neighboring circuit elements. The electrode 78 may be applied by processes, such as LEP, DEP, TIJ, or piezo inkjet, that have an accuracy and/or resolution coarser than the channel length 78.

Figure 12:
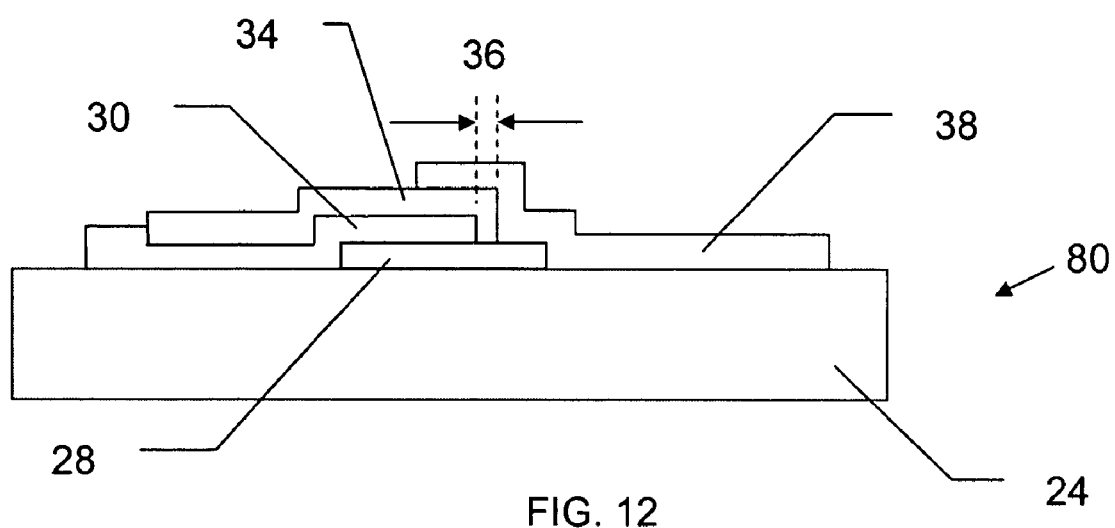
FIG. 12 is a schematic sectional view, similar to FIG. 6, of a sixth embodiment of a semiconductor device according to an embodiment of the invention.

Referring now to FIG. 12, a sixth embodiment of semiconductor device according to an embodiment of the invention is a diode 80. The diode 80 is similar to the second form of transistor 40 shown in FIG. 6, except that the diode 80 does not have a gate 22 or gate dielectric 26. The electrode 38, which in this embodiment is the drain, is arranged to extend over the entire length 36 of the channel. This extension of the drain 38 effectively acts as a gate hard-wired to the drain.

Although the invention has been described and illustrated with reference to exemplary embodiments thereof, it will be understood by those skilled in the art that various changes, omissions, and additions may be made thereto, without departing from the spirit and scope of the invention as recited in the attached claims. For example, in an alternative form of the first, second, third, or fourth embodiment, instead of anodization or another electrochemical process, the insulating layer 34 may be formed by electrophoretic or electrolytic deposition. The electrode 30 may then be formed from a wider range of materials, including materials that cannot be anodized to form a dielectric layer. Where the insulating layer is formed by deposition, the electrode may be formed by a wider range of processes, including inkjet printing, that may not provide a metal layer of suitable quality to form a satisfactory insulating layer by anodization. In another alternative form of these embodiments, the insulating layer 34 may be formed directly by oxidizing certain metals, including tantalum and tungsten, by heating in air. At temperatures tolerable in forming semiconductor devices, an oxide layer a few hundred nanometers thick may be formed by thermal oxidation in an hour or so.

The second source or drain electrode 62 in FIG. 8 could be formed without using selective wetting, or selective wetting could be used in forming the electrode 38 in FIG. 5 if the electrode 38 is formed by a liquid process. If the dielectric layer 34 is formed by deposition, then the deposited material may be one that selectively wets the metal of the electrode 30, and is substantially non-wetting of the semiconductor 28. The dielectric layer 34 is then less likely to spread out over the semiconductor 28 and alter the channel length. It is not necessary for the dielectric 34 to form a strong bond to the semiconductor 28. However, if adhesion between the semiconductor 28 and the dielectric 34 is not good, then liquid phase deposition of the electrode 38 or 62, which might penetrate into any gap at the interface between the semiconductor 28 and the dielectric 34, may not be appropriate.

An optional wetting layer 80 (see FIG. 8) may be used to promote wetting of the desired surface. The wetting layer may be selectively deposited by using a material with specific chemical affinities to the underlying material. In the case of a wetting layer applied to the source/drain electrode 30, the wetting layer could be applied electrochemically. Alternatively, or in addition, a repellent layer could be applied to a surface to discourage adhesion of a subsequent deposition. For example, in FIG. 8, a repellent layer 82 could be applied to the dielectric layer 34 to ensure that the material of the electrode 62 does not wet it. In any of the embodiments, other layers, for example, the insulator 27, that do not prevent the operation of the semiconductor device 20, 30, 40, 50, 60, 70, or 80 may be included.

The transistors shown in FIGS. 6 and 7 were described as having source and drain electrodes of different metals, and the transistors shown in FIGS. 5, 9, 11, and 12 were not described as having source and drain electrodes of different metals. However, any of the structures shown may be used with source and drain electrodes of the same or different metals. Either the source or the drain electrode may in general be the electrode 30 that is formed first. However, in some cases a specific electrode can be formed first. For example, if the insulating layer 34 is formed by anodization and only one electrode is of a material capable of being anodized, the anodizable electrode is the electrode 30 that is formed first. For example, in an embodiment such as the diode 80 shown in FIG. 12, the electrode that also acts as the gate is the electrode 38 that is formed second.

The source and drain electrodes 30, 38, 62, 78 in the embodiments have been described as being in electrical contact with the channel semiconductor 28 either directly or through an underlayer 21 forming a better electrical contact. However, the source and drain electrodes 30, 38, 62, 78 may be coupled to the channel semiconductor 28 in any way appropriate to a particular device, including conductive, capacitive, or inductive coupling. If capacitive or inductive coupling is used, a non-conductive underlayer 21 may be provided.

What is claimed is:

1. A method of forming a semiconductor device, comprising:

forming a first electrode electrically coupled with a semiconductor;

after forming said first electrode, forming an insulator over the semiconductor adjoining the first electrode and extending a selected distance from the first electrode; and after forming said insulator, forming a second electrode electrically coupled with the semiconductor adjoining the insulator.

2. A method according to claim 1, wherein forming the insulator further comprises at least partially covering the first electrode with the insulator.

3. A method according to claim 2, wherein forming the second electrode further comprises at least partially covering with the second electrode the part of the insulator that is at least partially covering the first electrode.

4. A method according to claim 1, wherein forming the second electrode further comprises at least partially covering the insulator with the second electrode.

5. A method according to claim 1, wherein forming said insulator comprises reacting the material of said first electrode to form an insulating layer of selected thickness on the surface of said first electrode.

6. A method according to claim 5, wherein reacting the material of said first electrode comprises anodizing a surface of the material of said first electrode.

7. A method according to claim 5, wherein reacting the material of said first electrode comprises thermally oxidizing a surface of the material of said first electrode.

8. A method according to claim 1, wherein forming said insulator comprises applying an insulating coating of selected thickness to said first electrode.

9. A method according to claim 8, wherein said insulating coating is applied by a method selected from the group consisting of electrophoretic deposition and electrolytic deposition.

10. A method according to claim 8, wherein forming said insulating coating comprises applying a material that wets said first electrode more readily than said semiconductor.

11. A method according to claim 1, wherein forming said insulator comprises applying an insulating layer with an edge at said selected distance from said first electrode.

12. A method according to claim 1, wherein forming said second electrode comprises applying a material that wets said semiconductor more readily than said insulator.

13. A method according to claim 1, wherein said first and second electrodes are formed in electrical contact with said semiconductor.

14. A method of forming a semiconductor device, comprising:

a step for providing a semiconductor material;

a step for forming a first electrode electrically coupled with the semiconductor material;

a step for forming an insulator in contact with the semiconductor material adjoining the first electrode and extending a selected distance from the first electrode; and a step for forming a second electrode electrically coupled with the semiconductor material adjoining the insulator; wherein said step for forming said insulator comprises a step for reacting the material of said first electrode to form an insulating layer of selected thickness on the surface of said first electrode.

15. A method according to claim 14, wherein said step for reacting the material of said first electrode comprises a step for anodizing the material of said first electrode.

16. A method according to claim 14, wherein said step for reacting the material of said first electrode comprises a step for thermally oxidizing the material of said first electrode.

17. A method according to claim 14, wherein said step for forming said insulator comprises a step for applying an insulating coating of selected thickness to said first electrode.

18. A method according to claim 14, wherein said step for forming said insulator comprises a step for applying an insulating layer with an edge at said selected distance from said first electrode.

* * * * *